United States Patent [19]

Pelosi et al.

[11] Patent Number: 6,034,862
[45] Date of Patent: Mar. 7, 2000

[54] DIODE MODULE ASSEMBLY WITH BIFURCATED TERMINALS

[75] Inventors: Walter Pelosi, Randolph; David Stevens Kerr, Morris Plains; Bassel Hage Daoud, Parsippany; Antonio Albino Figueiredo, Belleville, all of N.J.; Arnel Berton Citurs, Omaha, Nebr.

[73] Assignee: Lucent Technologies Inc., Murray Hill, N.J.

[21] Appl. No.: 09/097,251

[22] Filed: Jun. 12, 1998

[51] Int. Cl.⁷ ............................... H01L 23/62; H02H 3/20
[52] U.S. Cl. .................... 361/119; 361/820; 361/824; 257/686; 257/691; 257/692
[58] Field of Search ..................... 361/118, 119, 361/56, 57, 91, 98, 111, 117, 728, 747, 806, 807, 809, 820, 824, 775; 455/90, 117, 128, 217, 252.1, 347, 348, 349; 257/686, 723, 724, 726, 727, 691, 692, 698

[56] References Cited

U.S. PATENT DOCUMENTS

| | | | |
|---|---|---|---|
| 3,179,855 | 4/1965 | Brombaugh | 361/775 |
| 3,753,052 | 8/1973 | Rosser | 257/724 |
| 4,408,248 | 10/1983 | Bulley et al. | 361/91 |
| 4,796,150 | 1/1989 | Dickey et al. | 361/119 |
| 5,369,543 | 11/1994 | Bonnesen et al. | 361/117 |
| 5,386,335 | 1/1995 | Amano et al. | 361/56 |
| 5,442,519 | 8/1995 | DeBalko et al. | 361/784 |
| 5,512,784 | 4/1996 | Fried et al. | 257/724 |
| 5,532,900 | 7/1996 | Kim et al. | 257/726 |
| 5,631,806 | 5/1997 | Fried et al. | 361/728 |

*Primary Examiner*—Leo P. Picard
*Assistant Examiner*—John B. Vigushin

[57] ABSTRACT

A telecommunications protection unit includes a voltage unit having an electrically insulating base configured to house a diode module assembly and a voltage limiting cell therein. The voltage limiting cell and diode module assembly are retained within the housing by a bus clip. The housing includes structure for preventing damage to the voltage limiting cell and diode module assembly during placement of the bus clip thereon. The diode module assembly is a one-piece article including a bus bar and several diodes and terminals which can be used by itself or in a voltage unit to provide desired electrical effects and facilitate assembly of an electrical system such as a telecommunications protection unit. The terminals of the diode module are highly flexible to respond to excessive voltage and sneak current events encountered by telecommunications protection equipment, and the bus clip is constructed to provide a plurality of independently yieldable segments to accommodate diode stacks of variable heights and reduce manufacturing costs.

8 Claims, 9 Drawing Sheets

6,034,862

DIODE MODULE ASSEMBLY WITH BIFURCATED TERMINALS

RELATED APPLICATIONS

This application is related to co-pending U.S. application Ser. No. 09/096,688 filed Jun. 12, 1998, entitled VOLTAGE UNIT HOUSING; co-pending U.S. application Ser. No. 09/096,689 filed Jun. 12, 1998, entitled VOLTAGE UNIT BUS CLIP; and co-pending U.S. application Ser. No. 09/097,315 filed Jun. 12, 1998, entitled FLEXIBLE VOLTAGE UNIT TERMINAL.

FIELD OF THE INVENTION

This invention relates to the protection of communication equipment, and more particularly to improved arrangements for current and voltage overload protection.

BACKGROUND OF THE INVENTION

Protecting telecommunications equipment in telephone central offices or other locations against voltage surges and sneak currents is well known. For example, U.S. Pat. No. 4,796,150 discloses a solid state protector for insertion in a telephone line having tip and ring conductors. The protector comprises a current unit, a voltage unit and a pair of springs assembled within a housing structure. The voltage unit includes solid state devices that respond instantaneously to spurious voltage surges on the telephone line in the tip conductor, the ring conductor, or both tip and ring conductors. When a voltage surge exceeds a predetermined threshold, the voltage device operates to ground the telephone line thereby insuring that the spurious voltage bypasses the telephone equipment in the central office.

The voltage unit disclosed in U.S. Pat. No. 4,796,150 and similar voltage units including a voltage limiter, tip, ring and ground terminals and a plurality of diodes and metallic plates. All of these components are discrete elements which are not affixed to one another. These loose components must be assembled and maintained in a specific configuration within the voltage unit. If constant compressive force is not maintained in the assembly during manufacture of the voltage unit, the unit may fall apart and the small and fragile components may become lost or damaged, thereby requiring reassembly of the unit. With such reassembly comes attendant increases in manufacturing cost and time.

Additionally, by themselves, the voltage limiter, metallic plates, diodes and terminals possess utility separate and distinct from one another as a surge suppressor, simple conductor or diode, as the case may be. Individually, however, the several components cannot provide the sophisticated voltage surge protection of the voltage unit. Furthermore, their individual constructions are not adaptable, absent considerable modification, to other installation applications.

SUMMARY OF THE INVENTION

The present invention provides a voltage unit for use in a telecommunications protection unit having an electrically insulating housing configured to house a diode module assembly and a voltage limiting cell therein. The voltage limiting cell and the diode module assembly are retained within the housing by a bus clip.

To overcome the problem of loss or damage to individualized electrical components during assembly of a voltage unit and to broaden the installation capabilities of such components, the present invention provides an assembly including a plurality of terminals and diode stacks integrated into a unitary, one piece module. The diode module assembly can be used by itself or with a voltage limiter to achieve a variety of desired electrical effects and can be installed in applications and environments including, but not limited to, a voltage unit, insulation displacement connections and wire wrapping. Constructed as a one-piece assembly, the module may be manufactured and stored in inventory. Thereafter, the module may be easily and reliably placed as a unit in, for example, a voltage unit housing without loss or damage to its constituent components.

DETAILED DESCRIPTION OF THE INVENTION

Figure 1A:
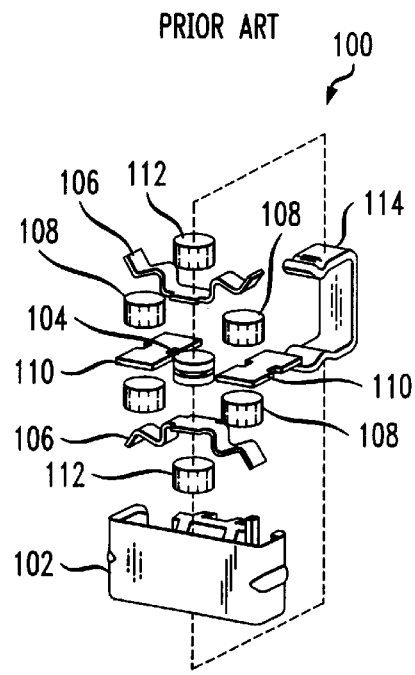
FIG. 1A is an exploded, isometric view of an existing voltage unit adapted for use in a telecommunications protection unit.

Collectively referring to FIGS. 1A, 1B, 1C and 1D, there is shown a voltage unit manufactured by Lucent Technologies, Inc., adapted for use in a telecommunications protection unit. The voltage unit, identified generally by reference numeral 100, typically includes an electrically insulating base or housing 102 which may be formed from polybutylene terephthalate (PBT) or other suitable moldable material. Voltage unit 100 further currently includes a self-triggering surge suppressor (or surgistor or voltage limiter) 104 constructed as a cell or disc package. Voltage limiter 104 is preferably a unidirectional type P247 manufactured by Teccor Electronics. The voltage limiter 104 is sandwiched between two metallic plates 106 having outwardly extending elongate wing segments. Four diodes 108, two on either side of the voltage limiter 104, are sandwiched between the elongate wing segments of plates 106. Diodes 108 are preferably PR4 type diodes manufactured by General Instrument. A metallic terminal 110 (either a tip or a ring terminal) is disposed between each of the two sets of diodes 108 and one of a pair of additional diodes 112, which are preferably of the same or similar type as diodes 108, is positioned exteriorly of a central region of each of the metallic plates 106.

Figure 1B:
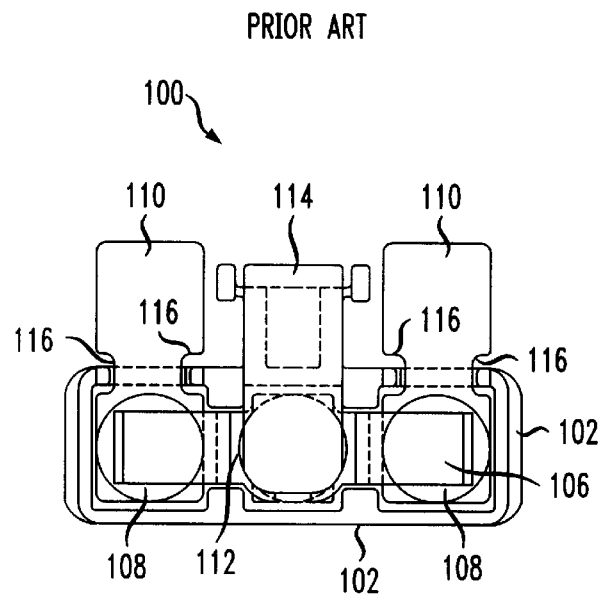
FIG. 1B is a plan view of the assembled voltage unit of FIG. 1A.
Figure 1C:
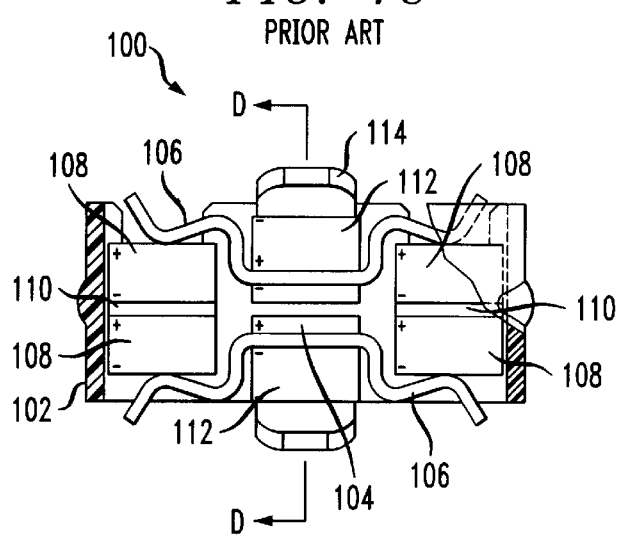
FIG. 1C is a partially cut side view of the assembled voltage unit of FIG. 1A.
Figure 1D:
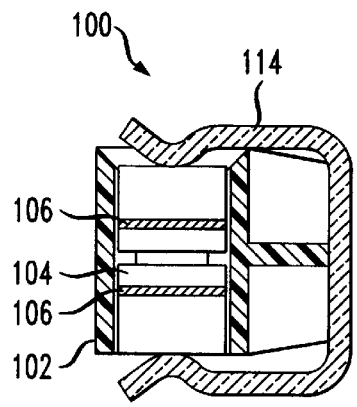
FIG. 1D is a sectional view of the assembled voltage unit of FIG. 1A taken along line D—D of FIG. 1C.

The operative electrical components of unit 100 are disposed within housing 102 in the manner most clearly depicted in FIGS. 1B, 1C and 1D and are retained therein by a narrow (relative to the length of housing 102) generally C-shaped metallic clip 114. Clip 114 electrically contacts the diodes 112 and compressively maintains the unit 110 in assembled condition. Additionally, each of the terminals 110 of voltage unit 100 incorporates a notch 116 (FIG. 1B) generally in a mid-region of each of its side edges to engagingly retain the terminals within the housing.

Although effective for its intended purpose, voltage unit 100 is costly to manufacture and rather difficult to assemble. Specifically, all of the electrical components of unit 100 are discrete elements which are not affixed to one another, yet must assume and maintain specific dispositions in the final assembly. If constant compressive force is not exerted against diodes 112 as clip 114 is placed thereon, or if clip 114 is improperly positioned on the diodes 112, e.g., it pivots out of proper placement alignment, the unit 100 may literally fall apart during the manufacturing process. Hence, as many as thirteen parts may have to be recovered and realigned (both structurally and electrically) before the assembly may be reassembled. Further, because of their small size and delicate construction, one or more of the voltage limiters 104, metallic plates 106, paddle terminals 110 and/or diodes 108, 112 may become lost or damaged if the assembly process fails. Moreover, even if assembly proceeds without apparent incident, the construction of housing 102 is such that it affords limited protection of the diodes 112 from crushing, chipping or similar damage which may occur as a result of the compressive and/or shear forces exerted by the clip 114 as it is positioned on diodes 112. The clip 114 may also fail to retain the electrical components within the housing if one or more of the diodes 108, 112 becomes damaged and reduces its thickness during operation.

The voltage limiter 104, metallic plates 106, diodes 108, 112 and terminals 110 have utility separate and distinct from one another as a surge suppressor, simple conductor or diode, as the case may be. However, the cooperation of the several components to provide sophisticated voltage surge protection is possible only if clip 114 is present. Moreover, their individual constructions do not render either the diodes 108, 112, terminals 110 or clip 114 readily adaptable to other installation applications. For instance, unless considerably modified, the various electrical components of voltage unit 100 are incapable of attachment to a printed circuit board or individual wire conductors.

A typical telecommunications protection unit for which voltage unit 100 is adapted for use contains two heat coils for sneak current overload protection of the tip and ring circuits. One heat coil is in operative contact with the tip terminal of the pair of terminals 110 as well as a first office pin and a first line pin of the protection assembly. The other heat coil is in operative contact with the ring terminal of the pair of terminals 110 as well as a second office pin and second line pin of the protection assembly. The term "office" and words of similar import as used herein refer to components connected to the central office telecommunications equipment (e.g., switching, transmission equipment, telephone, modem or computer) whereas the term "line" and the like refer to the outside telecommunications lines which transport signals to and from the central office equipment.

Each of the terminals 110 make mechanical and electrical contact with a respective one of the heat coils. Either or both of the heat coils must move during a power surge or sneak current event. For the protection unit to function properly, each terminal 110 must also move and maintain electrical contact with its associated heat coil. Otherwise, protection is lost and the damaging power is transmitted to the office telecommunications equipment. The elongate wing segments of plates 106 impart a yieldable spring force against diodes 108 which permits limited motion of the terminals 110 and diodes 108. To augment movement of the affected terminal(s) 110 during a power surge or a sneak current event, the side of each of terminals 110 opposite the heat coils is in contact with a compressed compression spring. The force exerted by the compression springs against the terminals 110 is intended to assure constant contact of either or both of terminals with the appropriate heat coil.

While generally useful to effectuate terminal movement under power surge or sneak current events, voltage unit 100 may be susceptible to failure in the event of exposure to certain voltage surges or sneak currents. That is, the limited movement afforded to the terminals 110 may be insufficient to provide rapid and reliable response to sudden movements of the heat coil(s) which might cause momentary breaches in contact between the affected terminal(s) 110 and the heat coil(s).

Figure 2:
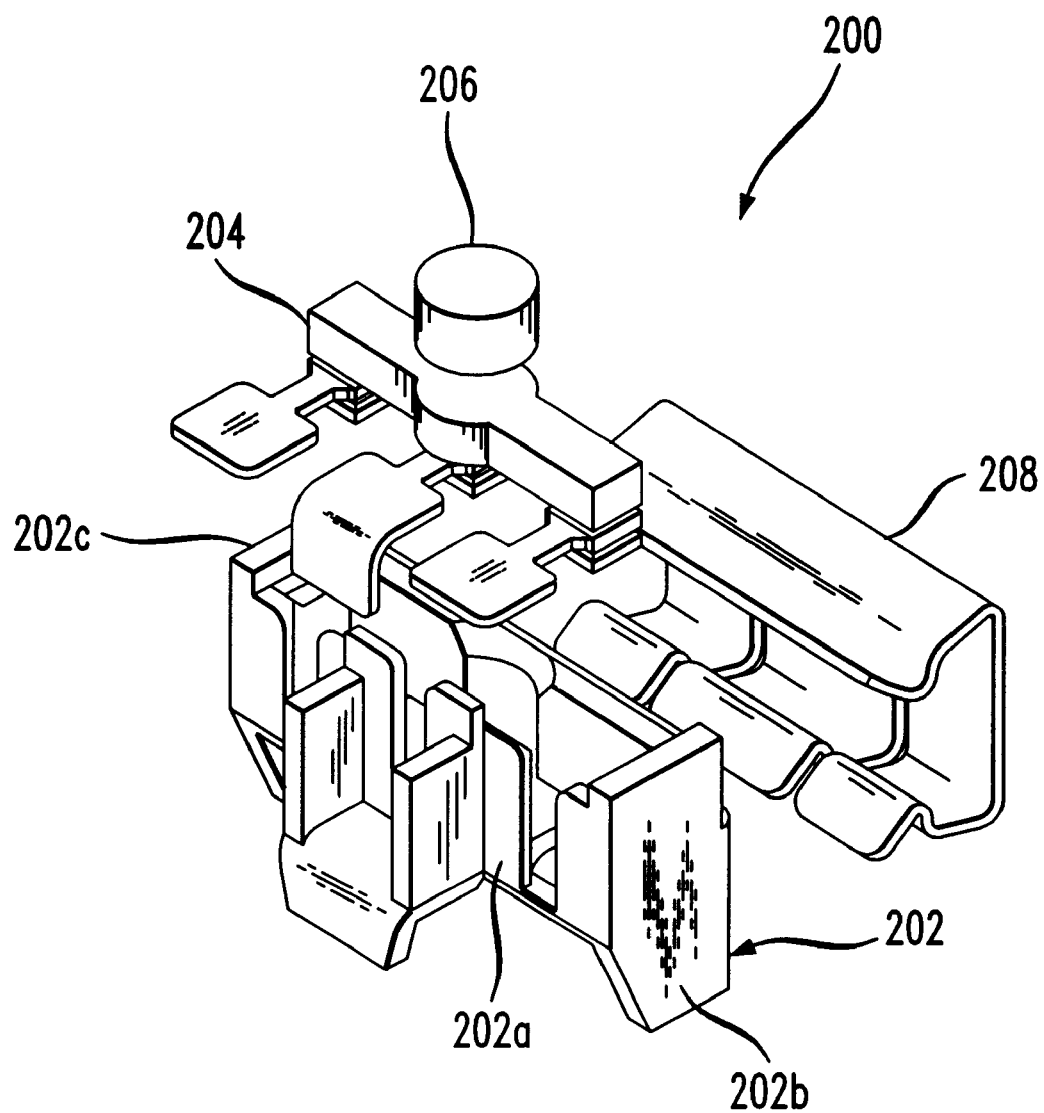
FIG. 2 is an exploded, isometric view of an embodiment of a voltage unit in accordance with the present invention.
Figure 3:
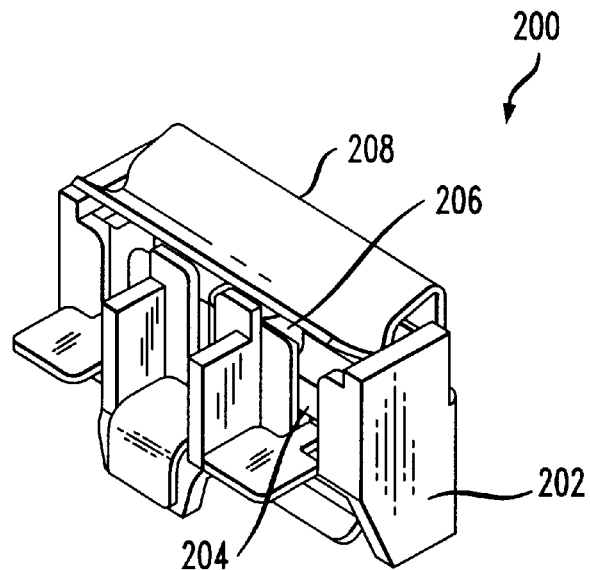
FIG. 3 is an isometric view of the assembled voltage unit depicted in FIG. 2.
Figure 4:
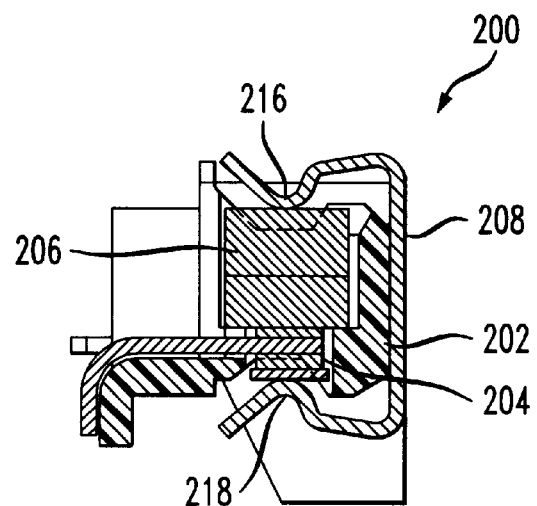
FIG. 4 is a sectional view of the assembled voltage unit depicted in FIG. 3.
Figure 8:
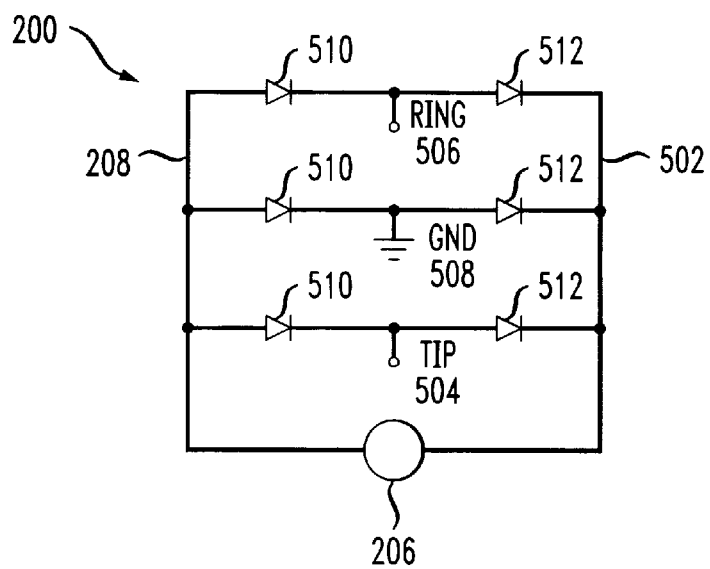
FIG. 8 is an electrical schematic diagram of the assembled voltage unit depicted in FIG. 3.

Referring to FIG. 2, there is shown an exploded, isometric view of an embodiment of a voltage unit of the present invention, which finds beneficial use, inter alia, in a telecommunications protection unit, generally referred to as 200. The voltage unit 200 includes an electrically insulating base or housing 202. The housing is preferably molded using a polybutylene terephthalate (PBT) or other suitable material. Housing 202 includes a central region 202a bounded by a pair of end plates 202b, 202c and is configured with various receptacle areas and slots of suitable dimensions to house a diode module assembly 204 and a voltage limiter 206. The voltage limiter 206 is preferably a type IEL limiter manufactured by Texas Instruments. An electrically conductive clip 208 described in greater detail with reference to FIGS. 12A and 12B retains the diode module assembly 204 and the voltage limiter 206 within the housing 202 as shown in FIGS. 3 and 4. The material of the clip 208 is preferably a beryllium copper alloy. When assembled, as depicted in FIG. 3, the voltage unit 200 establishes an electrical circuit as schematically depicted in FIG. 8 and results in a completed assembly consisting of four parts as opposed to the fourteen elements required to produce the voltage unit disclosed in U.S. Pat. No. 4,796,150.

Figure 5:
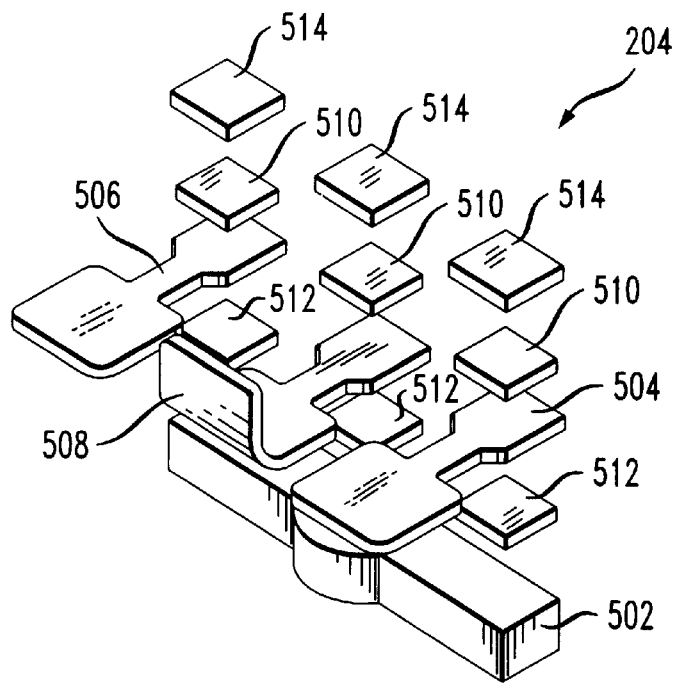
FIG. 5 is an exploded, isometric view of an embodiment of a diode module assembly in accordance with the present invention.
Figure 6:
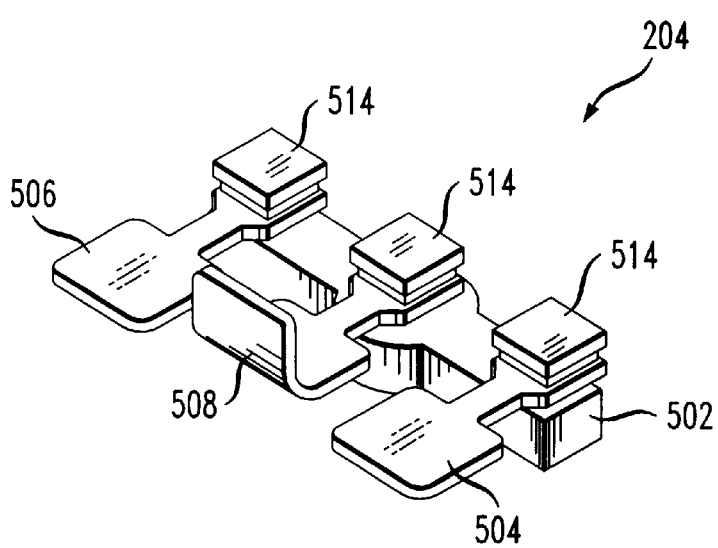
FIG. 6 is an isometric view of the assembled diode module assembly depicted in FIG. 5.
Figure 7:
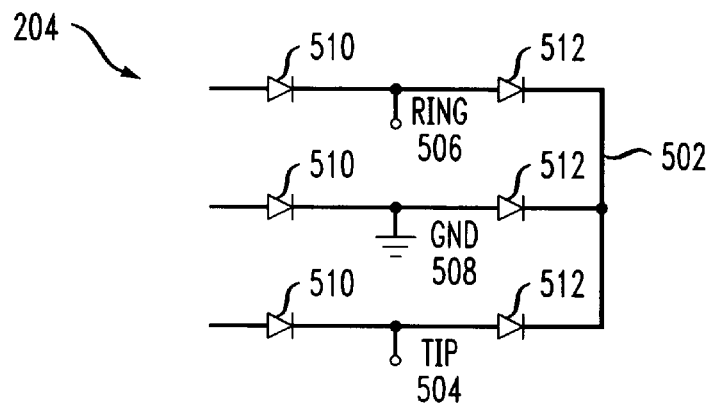
FIG. 7 is an electrical schematic diagram of the assembled diode module assembly depicted in FIG. 6.

An exploded, isometric view of the diode module assembly 204 is depicted in FIG. 5. The diode module assembly 204 includes an electrically conductive bus bar 502. The material of the bus bar is preferably a copper alloy. A first terminal 504, a second terminal 506 and a ground terminal 508 are each sandwiched between diodes 510 and 512. Either first terminal 504 or second terminal 506 may serve as a ring terminal while the other may serve as a tip terminal. For purpose of illustration only, terminal 504 may be considered a tip terminal and terminal 506 may be considered a ring terminal. The diodes 510, 512 are preferably type PR4 diodes manufactured by Texas Instruments and the material of the terminals 504, 506 and 508 is preferably an annealed copper alloy. The diodes 510 are each sandwiched between a respective terminal 504, 506 and 508, and a terminal cap 514. The material of the terminal caps 514 is preferably an annealed copper alloy. The bus bar 502, terminals 504, 506 and 508, diodes 510 and 512 and terminal caps 514 are preferably soldered or otherwise electrically and mechanically affixed together to form the unitary assembled diode module 204 as shown in FIG. 6. When assembled, the diode module establishes an electrical circuit as schematically depicted in FIG. 7.

Among the advantages arising from the integral or unitary construction of the diode module assembly 204 of the present invention is that it simplifies assembly of the voltage unit 200. For instance, the diode module assembly 204 is a single piece assemblage comprising several diode and conductor sub-components which can be easily and reliably placed as a unit in a correspondingly shaped receptacle in housing 202. By contrast, the various diodes, terminals and plates of the voltage unit 100 shown in FIGS. 1A–1D are "loose" items not integrally connected to one another. If not carefully placed individually into specific positions within housing 100, and maintained in those positions under the influence of continuous compression until proper placement of clip 114, one or more of these components may become misaligned or separated from the others. Consequently, the proper arrangement of parts must be carefully maintained before assembly of the voltage unit 100 may be completed. As will be appreciated, improper placement of any of the electrical components of voltage unit 100 requires reassembly of the unit and raises manufacturing costs.

The peripheral dimensions of bus bar 502, terminals 504, 506 and 508 and terminal caps 514 of diode module assembly 204 are desirably greater than the peripheral dimensions of diodes 510, 512 with which they are in contact. With the diode module assembly 204 so constructed, the diodes 510, 512 are effectively protected from physical trauma before, during and after placement of the diode module assembly into housing 202.

Moreover, the modular nature of the diode module assembly 204 enables it to be manufactured and stored in inventory. Thereafter, it may be used, either by itself or as a component of a voltage unit (as will be described in greater detail and in connection with the discussion of FIGS. 10A, 10B and 11), in an in-line telecommunications protection unit and other applications to produce electrical circuitry functions far more sophisticated, for example, than the individual diodes 108, 112 of voltage unit 100. Also, the diode module assembly 204 may be used with voltage limiters other than voltage limiter 206 to achieve differing levels of telecommunications equipment protection.

Figure 9:
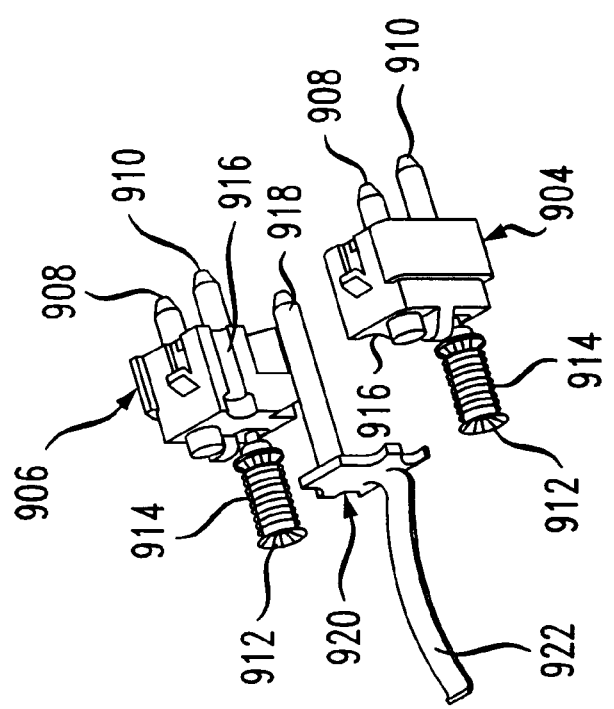
FIG. 9 is an exploded, isometric view of an embodiment of a telecommunications protection unit employing a voltage unit in accordance with the present invention.
Figure 9:
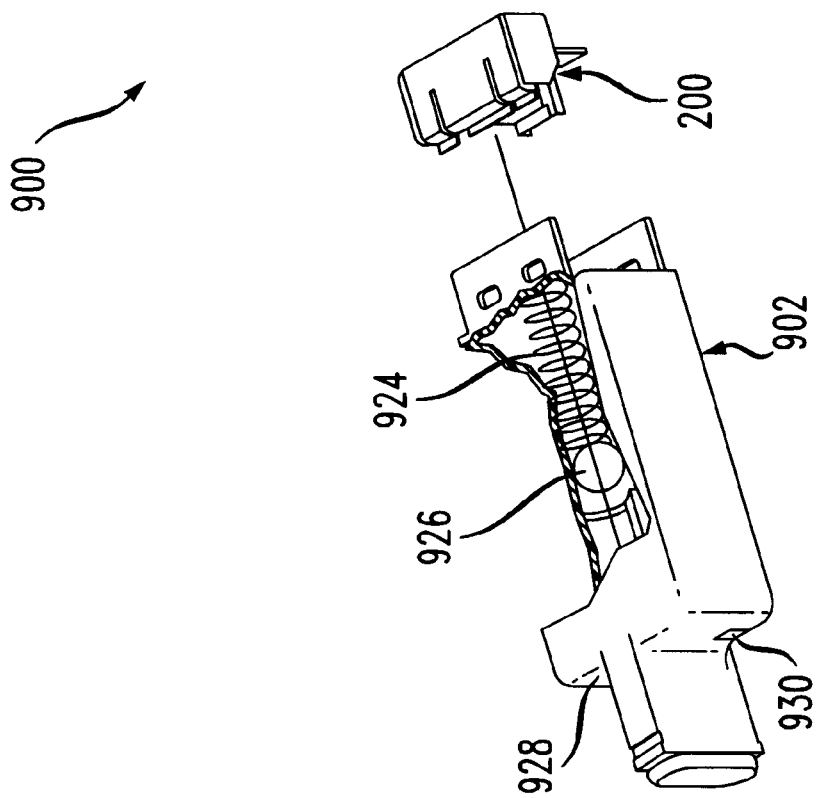

Referring to FIG. 9, there is shown an exploded, isometric view of a telecommunications equipment protection unit, generally designated 900, which employs a voltage unit 200 in accordance with the present invention. The protection unit 900 incorporates many of the structural features of the protection unit described in U.S. Pat. No. 4,796,150, the disclosure of which is incorporated herein by reference.

A presently preferred protection unit 900 includes a protector housing 902 formed from any suitable nonconductive material which may be molded and cured into a hollow, rugged and substantially rigid casing-type configuration. Protection unit 900 further includes a voltage unit, preferably unit 200 described above, a right coil assembly 904, and a left coil assembly 906. In a manner known in the art, each of the left and right coil assemblies 904, 906 includes a housing formed from suitable nonconductive material which retains a central office pin 908 communicable with the telecommunications equipment to be protected and a line pin 910 communicable with the outside telecommunications lines which transport signals to and from the central office equipment. Rearward projections of each of the line pins 910 are mechanically soldered and electrically connected to metallic, e.g., copper, sleeves 912. Surrounding each of the sleeves 912 is a heat coil 914, one end of which is secured to the sleeve and the other end of which is secured to a rearward projection of an appropriate central office pin 908. As is conventional, the heat coils 914 function as the sneak current limiters for protection unit 900. The housings of each of the left and right coil assemblies 904, 906 are preferably provided with a groove 916 adapted to accommodate approximately one-half of the circumference of a metallic ground pin 918 of a grounding assembly 920. Grounding assembly 920 further includes a metallic leaf-type ground spring 922 integrally connected to ground pin 918 and adapted for abutting contact with the ground terminal 508 of voltage unit 200.

Protection unit 900 additionally includes a pair of metallic compression springs 924, only one of which is shown in FIG. 9. A first end of each spring 924 contacts one of the tip and ring terminals 504, 506 of voltage unit 200 and a second end receives a metallic ball-like cap 926 which normally abuts against the interior surface of a rear wall 928 of housing 902. Rear wall 928 further preferably comprises a pair of openings 930 only one of which is shown in FIG. 9. Each opening 930 is in alignment with a respective one of the caps 926 to permit testing for continuity of the line.

As known in the art, springs 924 exert compressive spring force against tip and ring terminals 504, 506. Springs 924 are provided to maintain contact between the tip and ring terminals and sleeves 912 during periods of normal operation and during voltage and/or current overload events. The operation of springs 924, which itself does not form a part of the present invention, is described more fully hereinafter.

Figure 10A:
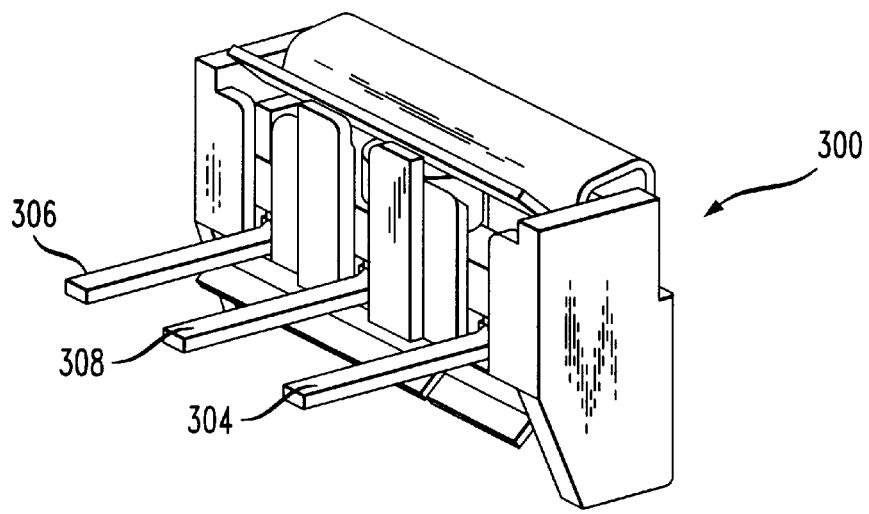
FIG. 10A is an isometric view of a further embodiment of an assembled voltage unit in accordance with the present invention.
Figure 10B:
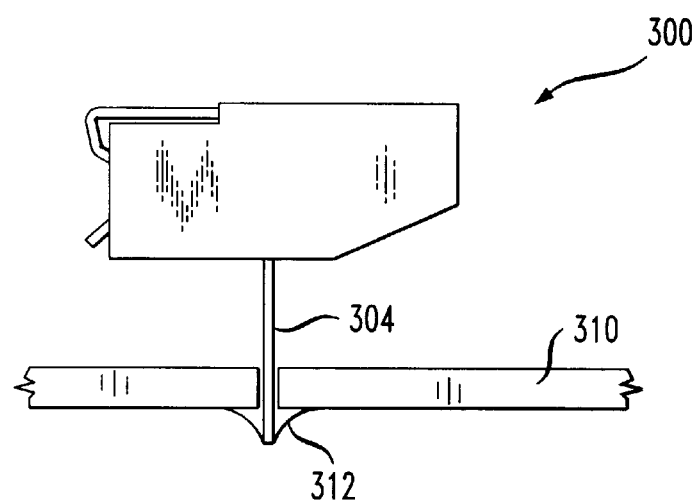
FIG. 10B is a view of the voltage unit depicted in FIG. 10A fastened to a printed circuit board.

FIGS. 10A and 10B reveal a further embodiment of a voltage unit in accordance with the present invention. The voltage unit, identified generally by reference numeral 300, is constructed and functions substantially similarly to previously described voltage unit 200. Accordingly, only those elements of voltage unit 300 which materially differ from voltage unit 200 or are otherwise necessary for a proper understanding of the invention will be described in detail herein.

One difference between voltage unit 300 and voltage unit 200 lies in the construction of their terminals. For example, the tip and ring terminals 504, 506 of voltage unit 200 lie in a common plane throughout their lengths (FIGS. 2–6). Ground terminal 508, however, lies in part in the plane established by tip and ring terminals 504, 506 and in part deviates from that plane. Indeed, at its distal end, ground terminal 508 curves away from the common plane of tip and ring terminals 504, 506 to an extent that it extends substantially perpendicular to such plane. It is this distal end of ground terminal 508 which abuts the ground spring 922 (FIG. 9) when the protection unit 900 is in assembled condition.

In contrast, the three terminals of voltage unit 300, respectively identified by reference numerals 304, 306 and 308, lie substantially in a common plane through their lengths. So constructed, terminals 304, 306, 308 may be inserted into appropriately sized and spaced slots or holes provided in a suitable substrate 310 such as a printed circuit board or the like and fixedly connected thereto by solder joints 312 or similar fastening means. It will also be understood that, although not illustrated, a diode module assembly similar to the diode module assembly 204 described hereinabove may also be affixed to a printed circuit board or similar substrate if provided with terminals constructed substantially similarly to terminals 304, 306, 308 of voltage unit 300.

Figure 11:
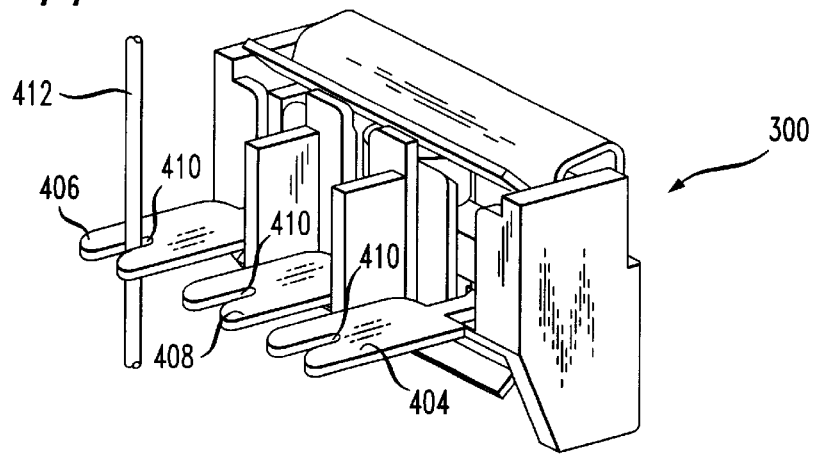
FIG. 11 is an isometric view of a further embodiment of an assembled voltage unit in accordance with the present invention.

Referring to FIG. 11, there is shown a further embodiment of voltage unit according to the present, identified generally by reference numeral 400. Like voltage unit 300 discussed immediately hereinabove, voltage unit 400 is substantially similar to voltage unit 200 and only material differences therebetween will be emphasized herein. Additionally, like voltage unit 300, a difference between voltage unit 400 and voltage unit 200 is in the construction of their terminals. More specifically, the terminals 404, 406 and 408 of voltage unit 400 lie substantially in a common plane throughout their lengths and are bifurcated at their distal ends to form slots 410. Slots 410 are desirably of suitable width to receive individual insulated wire conductors, one of which is represented by reference numeral 412, and sever the insulation of such conductors so as to establish an insulation displacement connection (IDC) with such wires. And, although not illustrated, it will be appreciated that a diode module assembly similar to diode module assembly 204 may be affixed to wire conductors if provided with terminals constructed substantially similarly to terminals 404, 406, 408 of voltage unit 400.

It will be understood that other diode module assemblies and/or voltage unit constructions consistent with the spirit of the present invention may be envisioned by those of ordinary skill in the subject art. For instance, the terminals of any of the diode module assemblies and/or voltage units of the present invention may be modified so as to accommodate wire wrapping or fitted with any suitable male or female connection elements so as to permit their connection to virtually any presently available circuitry, terminals or conductors.

Figure 12A:
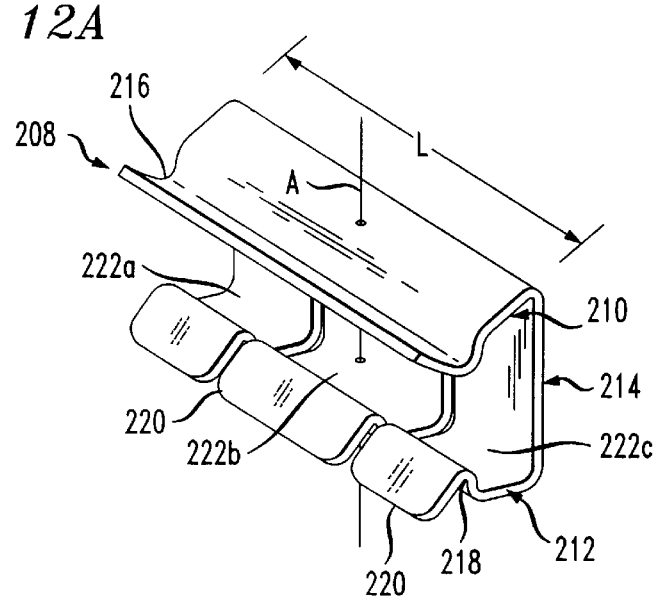
FIG. 12A is an isometric view of a preferred embodiment of a bus clip adapted for use with a voltage unit in accordance with the present invention.
Figure 12B:
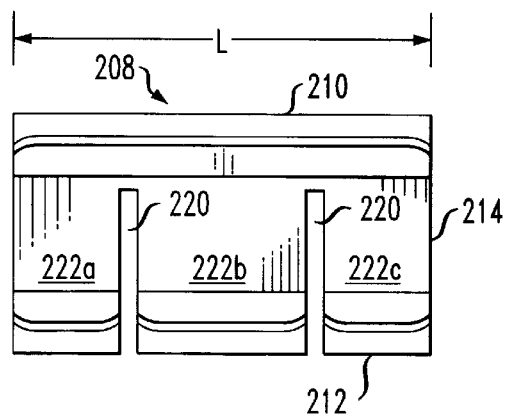
FIG. 12B is an elevation view of the bus clip depicted in FIG. 12A.

FIGS. 12A and 12B respectively depict enlarged isometric and front views of a presently preferred embodiment of a bus clip 208 suitable for use in assembling any of the voltage units herein described. Clip 208 is substantially C-shaped in cross-section and has a length L spanning a majority or, more preferably, substantially the entire length of housing 202 between end plates 202b, 202c (FIG. 2). A benefit arising from bus clip 208 extending for most and preferably nearly the entire distance between end plates 202b, 202c is that it is difficult to misalign the clip during placement. That is, end plates 202b, 202c function as lateral guides which effectively prevent undesirable rotation of the bus clip 208 about axis A (FIG. 12A) during placement into housing 202.

Clip 208 may be formed from any suitable metal stamping and/or bending techniques to produce a substantially stiff yet slightly yieldable member having flange portions 210, 212 joined by a web portion 214. Flange portions 210, 212 preferably include contiguous longitudinal inward and outward bends which together define opposed inwardly protruding elongate contact ridges 216 and 218. Upon assembly of voltage unit 200, for example, contact ridges 216, 218 compressively contact the outer surfaces of the voltage limiter 206 and diode module assembly 204, respectively, to retain and electrically connect the several electrical components within the housing 202.

A pair of spaced-apart, substantially parallel slots 220 extend generally transverse to the length L of clip 208 and preferably divide a substantial portion of web portion 214 and all of flange portion 212 into three independently yieldable segments 222a, 222b ad 222c. The contact ridge 218 of segment 222a is adapted to contact the diode stack, specifically, the terminal cap 514, associated with terminal 506 (FIGS. 5 and 6). Similarly, the contact ridge 218 of segment 222b is adapted to contact the diode stack (specifically, the terminal cap 514) associated with terminal 508, and the contact ridge 218 of segment 222c is adapted to contact the diode stack (specifically, the terminal cap 514) associated with terminal 504.

An advantage to segmentation of the bus clip 208 is that each segment 222a, 222b, 222c may operate independently to produce an essentially uniform contact force on each stack of diodes and provide reliable retention of the voltage unit assembly. Hence, if one stack of diodes becomes damaged and its thickness is reduced, the appropriate independently yieldable segment 222a, 222b, 222c moves accordingly to ensure contact with the damaged diode stack. Moreover, since each segment 222a, 222b, 222c independently moves to accommodate the height of its corresponding diode stack, precise manufacturing tolerances are not required for either the diode stacks or the bus clip 208 which reduces manufacturing costs and simplifies assembly of the voltage unit.

Figure 13:
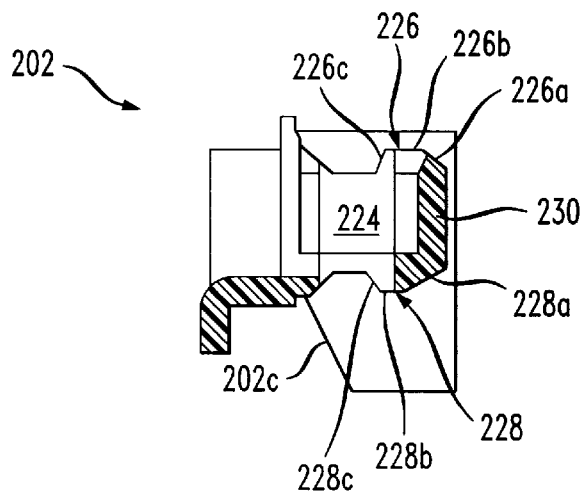
FIG. 13 is an elevational cross-section view taken through a central region of a preferred embodiment of a voltage unit housing adapted for use with a voltage unit in accordance with the present invention.

As mentioned previously, housing 202 of voltage unit 200 is formed with various receptacle and slot areas to accommodate the diode module assembly 204 and voltage limiter 206. One of those areas, identified by reference numeral 224 is shown in FIG. 13. Area 224 is of sufficient size to receive both the diode module assembly 204 and voltage limiter 206 in the manner shown in FIG. 4. In existing voltage unit designs such as, for example, voltage unit 100 (FIGS. 1A–1D), the exposed edges of diodes 112 may experience crushing, chipping and related damage as a result of the compressive and/or shear forces exerted by the clip 114 during assembly of the voltage unit. Such trauma may require replacement of one or more of the diodes thereby increasing manufacturing time and cost.

Housing 202 is desirably constructed to overcome this problem. More particularly, housing 202 is desirably configured with structure for preventing direct contact of the contact ridges 216, 218 of bus clip 208 with anything other than the exposed oppositely facing surfaces of the voltage limiter 206 and the diode stacks (specifically the terminal caps 514 shown in FIGS. 5 and 6).

As seen in FIG. 13, a presently preferred structure for protecting the diode module assembly 204 and voltage limiter 206 from damage during placement of bus clip 208 is at least one, or more preferably, a pair of guide members 226 and 228 provided along first and second opposite edges of a longitudinal housing wall 230 connecting and extending substantially perpendicular to end plates 202b, 202c. Guide members 226, 228 each preferably include an outwardly inclined first portion 226a and 228a, respectively. The first portions 226a, 228a urge outward separation of the contact ridges 216, 218 of the first and second flange portions 210,212 of the bus clip 208 with respect to the housing 202 as the clip is moved onto the housing (i.e., as the clip is moved from right to left with respect to housing when the housing is disposed in the orientation shown in FIG. 13). Adjacent and preferably contiguous with outwardly inclined first portions 226a, 228a, guide members 226, 228 further preferably include substantially uninclined second portions 226b and 228b, respectively, for maintaining the first and second webs 210, 212 in an outwardly urged or expanded condition and out of contact with the exposed corners and outwardly facing surfaces of the voltage limiter 206 and voltage diode assembly 204 as the bus continues leftwardly with respect to the housing 202 in FIG. 13.

Optionally, guide members 226, 228 further comprise inwardly inclined third portions 226c and 228c, respectively. Third portions 226c, 228c are disposed adjacent and preferably contiguous with the second portions 226b, 228b and permit somewhat controlled inward movement or contraction of the first and second flange portions 210, 212 with respect to the housing 202 as the bus clip continues leftward onto the housing. Upon passing the guide members 226, 228 the contact ridges 216, 218 of bus clip 208 come to rest directly upon the oppositely directed faces of the voltage limiter 206 and the diode stacks, specifically, the terminal caps 514, of the diode module assembly 204 as reflected in FIG. 4. As such, The fragile edges of the voltage limiter 206 and diode module assembly 204 are protected from harm from the bus clip 208 during assembly.

Figure 14:
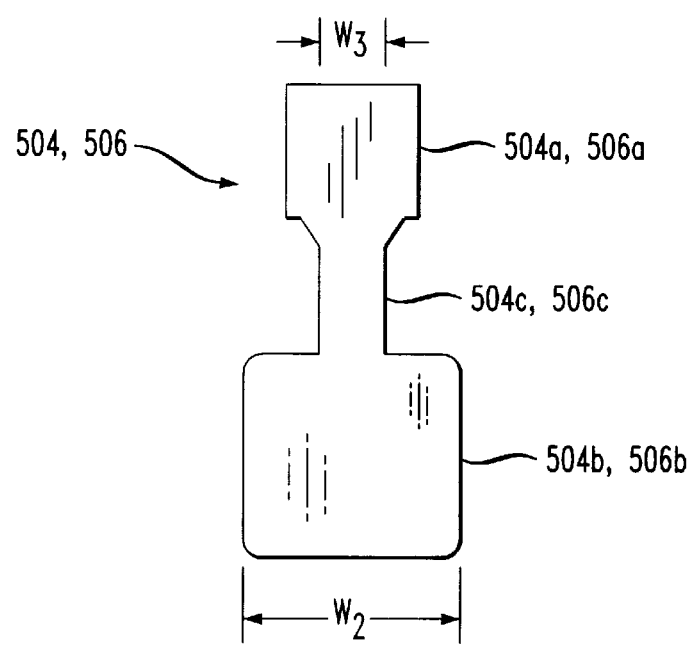
FIG. 14 is a plan view of a preferred embodiment of a contact adapted for use in a voltage unit in accordance with the present invention.

FIG. 14 illustrates a presently preferred construction of the terminals 504, 506, 508 described above in connection with FIGS. 5 and 6. As mentioned previously, it is known to use compression springs in telecommunications protection units such as unit 900 (FIG. 9) to enhance contact between the terminals of the voltage unit and the protection unit's heat coil sleeves. Under the influence of an excessive power surge or sneak current, the affected heat coil(s) heat up and the solder which connects a particular heat coil to its associated line pin melts. The sleeve about which the heat coil is wrapped is then urged to slide toward under the influence of the compression spring and contact the grounding assembly, thereby diverting the damaging voltage and/or current to ground.

As the sleeve slides, it carries its associated heat coil. If the tip and/or ring terminal of the voltage unit loses contact with the moving sleeve, the damaging power is sent to the telecommunications equipment rather than to ground. The paddle or terminal portions of contacts 110 (FIGS. 1A and 1B), for example, are designed for limited movement under the influence of a compression spring such as spring 924 (FIG. 9) upon the occurrence of a voltage surge or sneak current event. However, some sudden movements of sleeves 912 may be of sufficient magnitude to breach contact of the terminals 110 with the sleeves 912.

Terminal movement responsiveness may be enhanced by substituting the compression springs 924 with heavier duty springs with higher spring force. However, the force associated with such springs may damage other components of protection unit 900. Rather than using more forceful springs, the present invention proposes increasing the flexibility of the tip and ring terminals 504, 506.

Tip and ring terminals 504, 506 are preferably formed from copper alloy approximately 0.016 inch in thickness. As illustrated in FIG. 14, each terminal 504, 506 is preferably comprised of three portions. The first portion 504a, 506a is disposed between diodes 510 and 512 (FIG. 6). The second portion 504b, 506b is generally paddle-shaped and contacts the end of the compression spring 924 and the sleeve 912 as shown in FIG. 9. A comparatively narrow third portion 504c, 506c connects the first and second portions.

When the width $W_3$ of the terminal third portion 504c, 506c is about 50% or less of the width $W_2$ of the second portion 504b, 506b, increases in terminal flexibility are realized versus terminals configured according to terminals 110 of voltage unit 100. Moreover, the considerable flexibility imparted to terminals 504, 506 by third portions 504c, 506c reduces potential stresses from harming the integrity of the diode stack assemblies.

According to a presently preferred embodiment, for example, the width $W_2$ of second portion 504b, 506b is preferably about 0.14 inches and the width $W_3$ of the third portion 504c, 506c is approximately 0.04 inches. $W_3$ is thus approximately 29% of $W_2$. In contrast, the width of the corresponding notched portion of terminals 110 of voltage unit 100 is approximately two-thirds of the width of the paddle-shaped contact portion. Such a reduction in the terminal width of terminals 504, 506, however, has been found to afford sufficient strength to withstand the rigors normally encountered in the operation of a telecommunications protection unit yet provide terminal flexibility sufficient to respond to sudden movements of sleeve 912 (FIG. 9).

We claim:

1. A diode module assembly comprising:
   a plurality of bifurcated terminals;
   a plurality of diode stacks affixed and electrically connected to said plurality of terminals wherein each one of said diode stacks is associated with a respective one of said terminals; and
   a bus bar affixed and electrically connected to said diode stacks.

2. The diode module assembly as defined in claim 1 wherein said plurality of terminals comprise a tip terminal, a ring terminal and a ground terminal.

3. The diode module assembly as defined in claim 2 wherein at least said tip and said ring terminals lie in a substantially common plane throughout their lengths.

4. The diode module assembly as defined in claim 3 wherein said ground terminal lies in part in said plane and in part deviates from said plane.

5. The diode module assembly as defined in claim 1 wherein each of said diode stacks comprises a diode disposed on opposite sides of a respective one of said terminals.

6. The diode module as defined in claim 5 wherein each of said diode stacks further comprise a terminal cap disposed on a side of said diode stacks opposite said bus bar.

7. An assembly comprising:
   a voltage unit having a diode module assembly comprising:
      a plurality of bifurcated terminals;
      a plurality of diode stacks affixed and electrically connected to said plurality of terminals, wherein each one of said diode stacks is associated with a respective one of said terminals; and
      a bus bar affixed and electrically connected to said diode stacks; and
   a plurality of wires electrically connected to the terminals.

8. An assembly according to claim 7, wherein the terminals are insulation displacement connection terminals.

* * * * *